(12) United States Patent
Doerband et al.

(10) Patent No.: US 7,274,467 B2
(45) Date of Patent: Sep. 25, 2007

(54) PHASE SHIFTING INTERFEROMETRIC METHOD, INTERFEROMETER APPARATUS AND METHOD OF MANUFACTURING AN OPTICAL ELEMENT

(75) Inventors: Bernd Doerband, Aalen (DE); Stefan Schulte, Aalen-Waldhausen (DE)

(73) Assignee: Carl Zeiss SMT AG, Oberkochen (DE)

( * ) Notice: Subject to any disclaimer, the term of this patent is extended or adjusted under 35 U.S.C. 154(b) by 237 days.

(21) Appl. No.: 11/027,989

(22) Filed: Jan. 4, 2005

(65) Prior Publication Data

US 2006/0146342 A1    Jul. 6, 2006

(51) Int. Cl.
   *G01B 11/02*    (2006.01)
(52) U.S. Cl. ..................................... 356/512
(58) Field of Classification Search ................ 356/496, 356/511, 512, 513, 514, 515
   See application file for complete search history.

(56) References Cited

U.S. PATENT DOCUMENTS

| | | | |
|---|---|---|---|
| 4,340,306 A | 7/1982 | Balasubramanian | |
| 4,732,483 A | 3/1988 | Biegen | |
| 5,361,312 A | 11/1994 | Kuchel | |
| 5,473,434 A | 12/1995 | de Groot | |
| 5,488,477 A | 1/1996 | de Groot | |
| 5,777,741 A | 7/1998 | Deck | |
| 6,552,807 B1* | 4/2003 | Mitsutani et al. | 356/512 |
| 6,771,375 B2* | 8/2004 | Zanoni | 356/512 |
| 7,106,454 B2* | 9/2006 | De Groot et al. | 356/511 |
| 7,119,910 B1* | 10/2006 | Schellhorn | 356/512 |

FOREIGN PATENT DOCUMENTS

EP    0 455 218 B1    1/1995

OTHER PUBLICATIONS

D. Malacara, "Twyman-Green Interferometer", in "Optical Shop Testing", D. Malacara (ed.) 2nd Edition, John Wiley & Sons, Inc., 1992, Chapter 2.1, pp. 51 to 53 and chapter 2.6 pp. 73 to 77.
J. E. Greivenkamp et al., "Phase Shifting Interferometry", in "Optical Shop Testing", D. Malacara (ed.) 2nd Edition, John Wiley & Sons, Inc., 1992, Chapter 14, pp. 501 to 589.
T. Day, "Widely Tunable External Cavity Diode Lasers", SPIE vol. 2378, pp. 35 to 41.
P. P. Naulleau et al., "Extreme -Ultraviolet Phase Shifting Point Diffraction Interferometer: A Wave-Front Metrology Tool with Subangstrom Reference-Wave Accuracy", Applied Optics, vol. 38, No. 35, Dec. 10, 1999, pp. 7252 to 7263.
K. Creath, "Temporal Phase Measurement Methods", in "Interferogram Analysis: Digital Fringe Pattern Measurement Techniques", D. W. Robinson, Institute of Physics Publishing, Bristol and Philadelphia (1993), pp. 94 to 140.

* cited by examiner

*Primary Examiner*—Gregory J. Toatley, Jr.
*Assistant Examiner*—Michael A. Lyons
(74) *Attorney, Agent, or Firm*—Jones Day

(57) ABSTRACT

A phase shifting interferometric method and apparatus comprises generating at least four different phase shifts and recording interferograms corresponding to the different phase settings and recording interferograms corresponding to the different phase settings. In the analysis of the recorded interferograms the generated phase shifts between the at least four different phase settings are determined from the measurement, i.e. from the recorded interferograms. A model simulating the interferogram intensities may be used for determining the phase shifts. The phase shifts are free adaptable parameters of the model.

38 Claims, 4 Drawing Sheets a b c d

PHASE SHIFTING INTERFEROMETRIC METHOD, INTERFEROMETER APPARATUS AND METHOD OF MANUFACTURING AN OPTICAL ELEMENT

BACKGROUND OF THE INVENTION

1. Field of the Invention

The present invention generally relates to the field of phase shifting interferometry. In particular, the invention relates to a phase shifting interferometric method, a phase shifting interferometer apparatus and applications using such method and apparatus. One particular application of the phase shifting interferometry is in the field of testing and manufacturing an object such as an optical element.

2. Brief Description of Related Art

An optical element may comprise, for example, an optical component such as an optical lens or an optical mirror used in optical systems, such as telescopes used in astronomy, and systems used for imaging structures, such as structures formed on a mask or reticle, onto a radiation sensitive substrate, such as a resist, in a lithographic method. The success of such an optical system is substantially determined by the accuracy with which the optical surface can be machined or manufactured to have a target shape determined by a designer of the optical system. In such manufacture it is necessary to compare the shape of the machined optical surface with its target shape, and to determine differences between the machined and target surfaces. The optical surface may then be further machined at those portions where differences between the machined and target surfaces exceed e.g. predefined thresholds.

Interferometric apparatuses are commonly used for measurements of optical surfaces. Examples of such apparatus are disclosed in U.S. Pat. Nos. 4,732,483, 4,340,306, 5,473,434, 5,777,741, 5,488,477. The entire contents of these documents are incorporated herein by reference.

Conventional phase shifting interferometry "PSI" is a data collection and analysis method for obtaining a high accuracy result from interferometric measurements. Various methods and background information of phase shifting interferometry is available from the articles by J. E. Greivenkamp et al. at "Phase shifting interferometry" in Optical Shop Testing edited by D. Malacara, 2nd edition, Wiley Interscience Publication (1992), and Catherine Creath "Temporal Phase Measurement Methods" in Interferogram Analysis, Digital Fringe Pattern Measurement Techniques, edited by D. W. Robinson et al., Institutes of Physics Publishing, Bristol and Philadelphia, 1993. These articles are incorporated herein by reference.

In conventional phase shifting interferometry, the relative phase between interfering beams of the interferometer is changed in a predetermined manner, and a plurality of interferograms is recorded while changing the relative phase. The knowledge on the phase settings is used for the analysis of the interferograms to determine the desired distribution of relative phases across the interfering beams.

It has been found that in some situations the resulting accuracy of the interferometric measurements using PSI is not as high as expected.

SUMMARY OF THE INVENTION

The present invention has been accomplished taking the above problems into consideration.

It is an object of the present invention to provide a phase shifting interferometric method and apparatus for achieving a relatively high measuring accuracy.

It is a further object of the present invention to provide a method of manufacturing an optical element with a relatively high accuracy.

The foregoing objects can be accomplished by providing a phase shifting inteferometric method in which at least four interferograms are recorded at different phase settings of the interfering beams relative to each other. The actual values of differences between the different phase settings are determined from an analysis of the recorded images rather than using predetermined values for the values of the phase differences. Thus, the phase shifting interferometric method according to the present invention does not rely on an accuracy with which phase shifts (i.e., differences between phase settings) are generated. The phase shifts can be generated wherein the amounts of phase shifts may be predetermined (e.g., in software) or may be values specified by an operator. The values may be disturbed due to noise or other influences. Predetermined values of the phase shifts may be used in a subsequent analysis as starting values, for example. The final result of the analysis does not rely on the exact values of the predetermined phase shifts, however. Moreover, the actual values of the phase shifts which were generated are determined from the recorded interferograms such that "true" and precisely determined phase shifts which have been generated are used for further analysis of the interferograms.

According to an exemplary embodiment of the invention, the method includes a model for approximating interferograms (e.g., for numerically fitting the interferograms). The model has a plurality of adaptable parameters, wherein the plurality of adaptable parameters comprises at least three phase parameters representing the actual generated phase shifts or relative phase shifts. The adaptable parameters of the model are adapted such that the model sufficiently approximate the recorded interferograms.

According to an exemplary embodiment of the invention, the phase shifting interferometric method of measuring an object comprises superimposing reference light with measuring light having interacted with the object; generating at least four different phase settings of the reference light relative to the measuring light superimposed therewith; detecting an image of an intensity distribution of the superimposed reference light and measuring light at each of the different phase settings; determining, for each of the different phase settings, a distribution of values corresponding to relative phases between the reference light and the measuring light superimposed therewith, based on the detected images and based on a model for approximating the distribution of the values corresponding to the relative phases, wherein the model has a plurality of adaptable parameters, and wherein the plurality of adaptable parameters comprises at least three phase parameters related to actual values phase differences between the different phase settings; and determining a distribution of a physical property of the object across an area thereof, based on the determined distribution of the values corresponding to the relative phases.

The values corresponding to the relative phases may be identical to the relative phases or any other values which may be derived from the relative phases. Some non-linearity examples are illustrated as follows: The values corresponding to the relative phases may also represent optical path differences calculated from the relative phases by multiplying with the wavelength of the measuring light and dividing by $2\pi$. The values may also represent other properties, such as surface errors of the tested object relative to a reference surface, which surface errors are half of the optical path differences.

The physical properties of the object may be any property which can be derived from the recorded images. The physical property may comprise a relative phase between the reference light and the measuring light, an optical path difference between a measuring arm and a reference arm of the interferometer apparatus used for the measurement, a refractive index of the tested object, and any other property which may be calculated from the recorded images.

The different phase settings may be generated in any conventional manner, such as by a piezoelectric transducer used for shifting or translating any of the components defining the optical system of the interferometer apparatus. For example, a mount for the measured object may be translated using a piezoelectric transducer or some suitable other means, or a reference mirror defining the reference arm of the interferometer may be shifted. Further, the wavelength or frequency of the measuring light may be changed for generating the different phase settings. This may be achieved by using a light source with adjustable wavelength, such as an external cavity diode laser (ECDL).

Since the actual values of the phase shifts or differences there-between are determined from the recorded images, no particularly high accuracy is necessary for adjusting the different phase shifts. The only requirement as to the phase shifts is that a sufficient number thereof is different from each other. In particular, even a random mechanical vibration of the interferometer apparatus may be sufficient to generate the necessary phase shifts between subsequent image recordings.

The model may be any suitable model which is able to approximate the distribution of relative phases between the reference and measuring light or any other distribution which may be derived therefrom. According to an exemplary embodiment of the invention, the model is suitable to reproduce or approximate intensity distributions of the recorded images. For this purpose, the model is dependent on a plurality of adaptable parameters. A suitable selection of these parameters will result in that the intensity distributions produced by the model substantially correspond to the measured intensity distributions of the images. It will then be possible to derive the desired distribution of relative phases between the reference and measuring light beams, or any other distribution amounts corresponding to the relative phases, from the adapted model.

According to an exemplary embodiment of the invention, differences between the measured image intensities and the corresponding intensities calculated from the model are determined and used as a basis for changing the adaptable parameters of the model in view of improving the model. In particular, the differences may be calculated for each pixel of a recorded image and, in particular, for each pixel of all images. The method may further comprise a least squares approximation of the model based on these differences or any other suitable approximation method.

The model may include a detailed model of interferogram intensities corresponding to the images. According to an exemplary embodiment, the model of interferogram intensities comprises a term or expression which is indicative of an average intensity distribution which is constantly present in all images.

According to a further exemplary embodiment, the model of the interferogram intensities comprises a term or expression indicative of an average intensity modulation distribution present in all images.

According to a further exemplary embodiment, the model of the interferogram intensities includes a model of a non-linearity of a detector used for recording the images.

According to a further exemplary embodiment, the model of the interferogram intensities comprises at least one expression associated with the images and which may be represented or sufficiently approximated by a sum of a first term representing a distribution of adaptable parameters of the model and associated with all images, a second term representing an adaptable parameter associated with one single image, a third term representing a product of a first image coordinate and an adaptable parameter associated with one single image, and a fourth term representing a product of a second image coordinate and an adaptable parameter associated with one single image. Thus, the at least one expression is useful to represent a distribution of a physical property across the respective images, wherein intensity deviations from an average between images and linear deviations across each image are accounted for.

A phase shifting interferometer apparatus for measuring an object is further provided, which interferometer apparatus operates according to the phase shifting interferomtric method illustrated above.

A method of analyzing a plurality of phase shifted interferograms is further provided, wherein the method provides a model for approximating the interferograms as illustrated above, wherein also values of phase shifts or differences between phase shifts associated with the analyzed interferograms are adaptable parameters of the model.

A computer-readable carrier containing information representing a computer program adapted to cause a processing to execute methods described herein is further provided. The computer readable carrier can be any suitable type of carrier such as solid-state memory, magnetic memory, optical memory, other type of memory, or modulated waves/signals (e.g., radio frequency, audio frequency, or optical frequency modulated waves/signals) suitable for being transmitted through any suitable network, such as the internet.

The invention further provides a method of manufacturing an optical element using phase shifting interferometry as illustrated above, wherein the optical element is processed in dependence of a result of the phase shifting interferometric method.

According to an exemplary embodiment of the invention, a deviation of a surface shape of the optical element from a target shape thereof is determined and the processing is carried out in dependence of the determined deviations.

According to a further exemplary embodiment, the measuring light having interacted with the object is measuring light reflected from a surface thereof. According to an alternative exemplary embodiment, the measuring light having interacted with the object is measuring light having traversed the surface of the object.

The processing of the optical surface may comprise a machining such as milling, grinding, loose abrasive grinding, polishing, ion beam figuring, magneto-rheological figuring, and finishing of the optical surface of the optical element. The processing may also comprise a processing using a hand-held tool or other suitable tool moved directly or indirectly across the surface due to a movement of a hand or arm of an operator.

According to an embodiment, the finishing comprises applying a coating to the optical surface. The coating may comprises a coating such as a reflective coating, an anti-reflective coating and a protective coating.

BRIEF DESCRIPTION OF THE DRAWINGS

The forgoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

Figure 1:
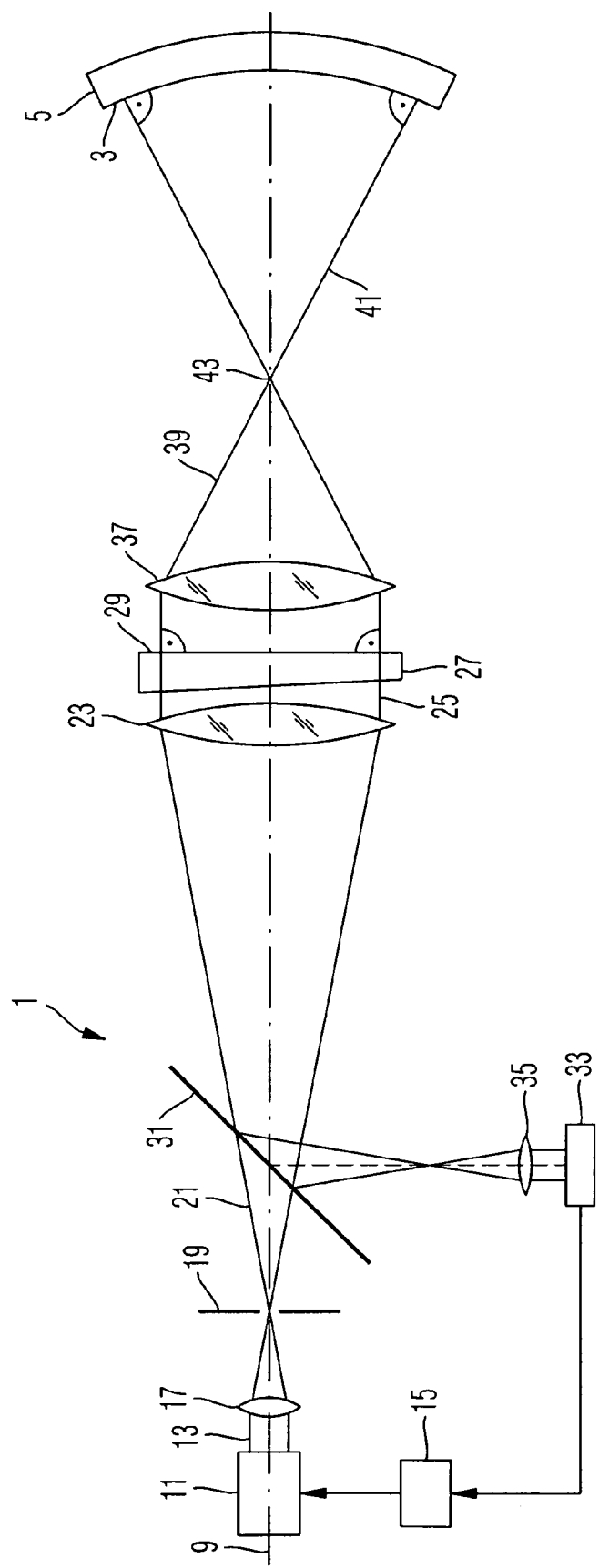
FIG. 1 is a schematic illustration of a phase shifting interferometer apparatus according to a first embodiment of the invention.

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

FIG. 1 schematically illustrates an exemplary phase shifting interferometer apparatus 1 for measuring a shape of a surface 3 of an object 5. In the example shown in FIG. 1, the object is a lens made of glass, and the surface 3 to be measured is a concave surface. The invention is not limited to such object, however.

The interferometer apparatus 1 comprises a light source 11 for generating a light beam 13. The light source 11 is of a type which generates the light beam 13 such that it is sufficiently coherent for generating interferograms using the apparatus 1, and such that a wavelength of the light of beam 13 may be changed within a suitable range. An example of such type of light source is an external cavity diode laser (ECDL), the ECDL type of light source is illustrated for example in the article "Widely Tunable External Cavity Diode Lasers" by Tim Day et al. and is commercially available from the company New Focus, Inc., 1275 Reamwood Avenue, Sunnyvale, Calif. 94089, USA.

The light source 11 is controlled by a controller 15 such that the controller 15 determines the wavelength of beam 13 to be emitted by the light source 11.

Beam 13 is focused by a focusing lens arrangement 17, such as a micro-objective, onto a pinhole of a spatial filter 19 such that a diverging beam 21 of coherent light originates from the pinhole of the spatial filter 19. Wavefronts in the diverging beam 21 are substantially spherical wavefronts. The diverging beam 21 is collimated by a collimating lens arrangement 23 to form a substantially parallel beam 25 having substantially flat wavefronts. Parallel beam 25 traverses a wedge-shaped plate 27 having a flat surface 29 which is orthogonally disposed in beam 25 to form a Fizeau surface of the interferometer apparatus 1. The Fizeau surface 29 is semi-transparent and reflects a portion of the intensity of beam 25 to form a beam of reference light which travels back along optical axis 9, is collimated by collimating lens arrangement 23 to form a converging beam which is reflected from a beam splitter 31 disposed in diverging beam 21, to be incident on a camera 33 after traversing a camera optics 35. The camera 33 may be of the CCD-type, having a plurality of photosensitive pixels, such as 2000×2000 pixels.

A portion of light beam 25 traversing Fizeau surface 29 is collimated by an interferometer optics 37 to form a converging beam 39 which will form a diverging beam 41 having substantially spherical wavefronts downstream of a cross-over 43. Diverging beam 41 is substantially orthogonally incident on surface 3 to be measured.

Measuring light reflected from surface 3 forms a converging beam 41 traversing the cross-over 43, forming a diverging beam 39 downstream thereof, traversing interferometer optics 37 to form a substantially parallel beam traversing the Fizeau surface 29. After having traversed the Fizeau surface 29, the beam of measuring light is superimposed with the reference beam reflected from the Fizeau surface 29 such that the camera 33 detects an interferogram having a fringe pattern representing a distribution of relative phases between the measuring light and the reference light.

The images detected by the camera 33 are supplied to the controller 15 and stored in a memory thereof. In particular, the controller 15 controls the light source 11 such that the beam 13 subsequently has four different wavelengths, resulting in four different phase settings of the reference light relative to the measuring light superimposed with the reference light on the camera 33. The controller 15 records an image detected by the camera 33 for each of the four different phase settings. Representative examples of such four different images are shown in FIGS. 3a to 3d.

Figure 2:
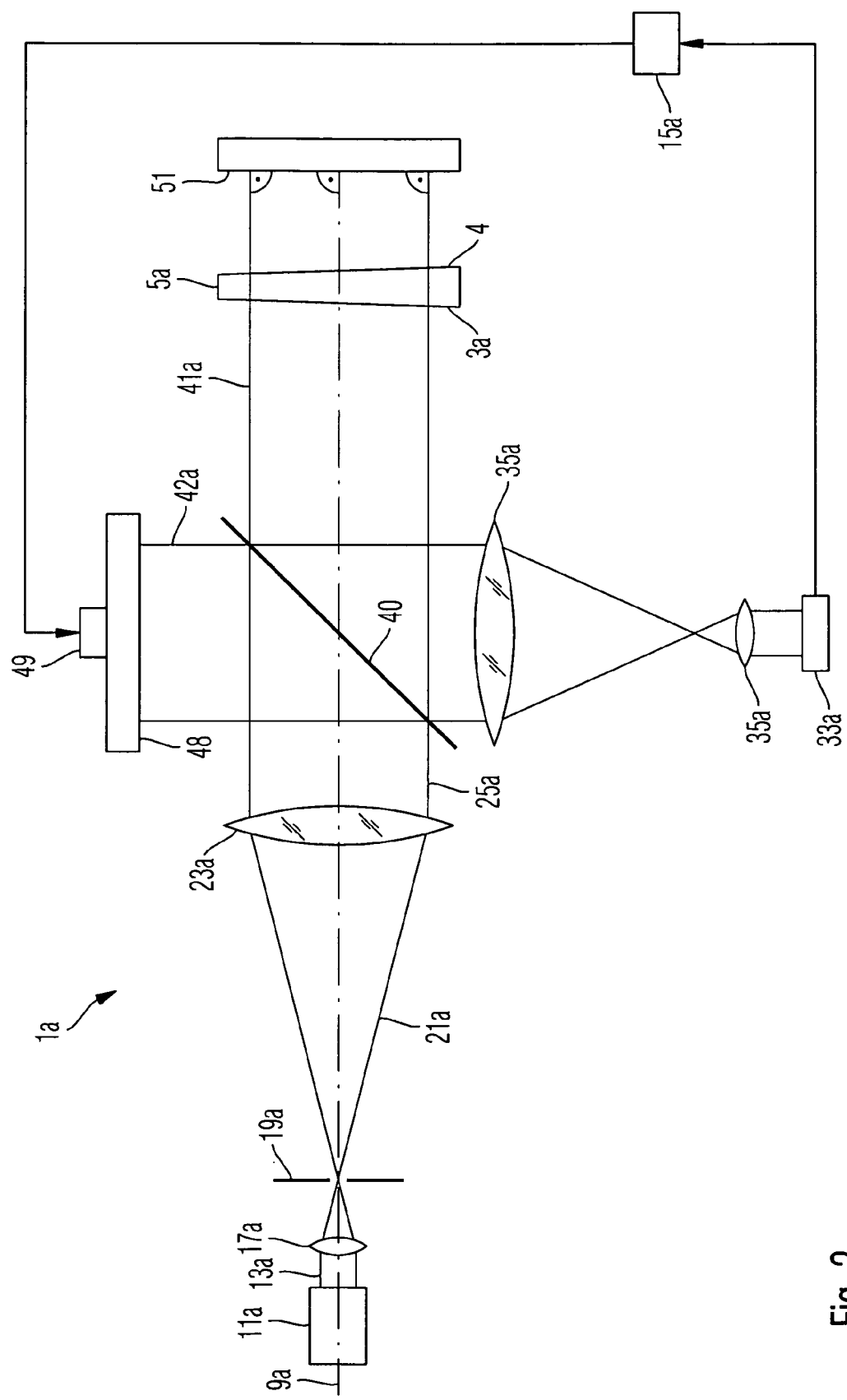
FIG. 2 is a schematic illustration of a phase shifting interferometer apparatus according to a second embodiment of the invention.

FIG. 2 schematically illustrates a further phase shifting interferometer apparatus 1a for measuring a physical property of an object 5a.

As will be further illustrated below, the apparatus shown in FIG. 2 differs from that shown in FIG. 1 at least in several aspects:

The interferometer apparatus is of a Twyman-Green-type rather than a Fizeau type; the phase shifts are generated by a displacement of a component of the optical system rather than a change of wavelength of the measuring light; the measured physical property is a distribution of optical density deviations from an average optical density of the object rather than a surface shape of the object; and others. However, these differences are not intended to limit the scope of the present invention to the two exemplary embodiments shown in FIGS. 1 and 2. Moreover, any other combination of interferometer types, measured physical properties and means for generating different phase settings are envisaged within the present invention.

The interferometer apparatus 1a comprises a light source 11a, such as a Helium-Neon laser generating a laser beam 13a which is focused on a pinhole of a special filter 19a by a micro-objective lens arrangement 17a. A diverging beam 21a of light emerges from the pinhole and is transformed into a substantially parallel beam 25a of light by a collimating lens arrangement 23a. A beam splitter 40 is disposed in beam 25a to generate a beam 41a of measuring light traversing the beam splitter 40 and a-beam 42a of reference light reflected from the beam splitter 40. The beam 42a of reference light is reflected from a reference mirror 48 which is oriented substantially orthogonally with respect to a direction of beam 42a such that the beam 42a of reference light is reflected therefrom and traverses beam splitter 40 to be incident on a camera 33a after traversing a camera optics 35a.

The beam 41*a* of measuring light traverses the object to be measured which is, in the present example, a plate 5 having two flat surfaces 3, 4. After traversing the object to be measured, the beam 41*a* of measuring light is substantially orthogonally incident on a further mirror 51 such that the beam of measuring light is reflected therefrom, traverses the object 5 again and is reflected from beam splitter 40 to be incident onto the camera 33*a*. Thus, the camera 33*a* will record an interferogram generated by the superimposed beams 41*a* and 42*a* of measuring and reference light.

The reference mirror 48 is mounted on a piezoelectric actuator 49 controlled by a controller 15*a*. By controlling the actuator 49, the reference mirror 48 is displaced in a direction of the beam 42*a* of reference light to generate a phase shift in this beam 42*a* of reference light which will result in a shift of interference fringes in the image detected by camera 33*a*.

Similar to the embodiment illustrated with reference to FIG. 1 above, the controller 15*a* will generate at least four different phase settings by actuating the actuator 49, and the controller 15*a* will record an interferogram detected by camera 33*a* for each of the different phase settings. The interferograms shown in FIGS. 3*a* to 3*b* are also representative examples of interferograms which may be recorded using the apparatus 1*a* shown in FIG. 2.

A method of analyzing the interferograms recorded at different phase settings will be illustrated below, wherein the recorded intensities of the interferograms or images detected by the camera are indicated as $J_i(x,y)$ wherein i is an index indicating the $i^{th}$ interferogram, x is indicative of a first detector coordinate, and y is indicative of a second detector coordinate, such that each pair of values (x,y) indicates one particular pixel. For example, the first detector coordinate x and the second detector coordinate y may be Cartesian coordinates, polar coordinates, or any suitable coordinates.

According to an exemplary embodiment, a model can be used to approximate the intensities $J_i(x,y)$ wherein the amounts of phase shifts generated by the controller are free adaptable parameters of the model.

An example of such model may be represented by the following formula:

$$I_i(x, y) = a_i(x, y) + b_i(x, y)\cos(\Delta_i(x, y)) + c_i(x, y)\sin(\Delta_i(x, y)) + \quad (1)$$
$$d_i(x, y)\cos(2\Delta_i(x, y)) + e_i(x, y)\sin(2\Delta_i(x, y))$$

Herein, $I_i(x,y)$ represents the approximated intensity values, i is again an index indicative of the interferogram corresponding to a particular phase setting, and x and y are indicative of a coordinate or pixel in the respective interferogram.

The term $a_i(x,y)$ represents a location dependent intensity of interferogram i and can be further modeled as $$a_i(x, y)=am(x, y)+da_i+ax_i\cdot x+ay_i\cdot y, \quad (2)$$

wherein
 am(x,y) is a location dependent average of the intensity over all images,
 $da_i$ is a constant intensity deviation from the average am(x,y) of the $i^{th}$ interferogram, and
 $ax_i$ and $ay_i$ are linear deviations from the average am(x,y) of the intensity in the x- and y-directions in the $i^{th}$ interferogram.

The term $b_i(x,y)$ in equation (1) represents a location dependent contrast of the cosine type of the $i^{th}$ interferogram and can be further modeled as $$b_i(x, y)=bm(x, y)+db_i+bx_i\cdot x+by_i\cdot y, \quad (3)$$

wherein
 bm(x,y) is a location dependent average of the constrast over all images,
 $db_i$ is a constant intensity deviation from the average bm(x,y) of the $i^{th}$ interferogram, and
 $bx_i$ and $by_i$ are linear deviations from the average bm(x,y) of the intensity in the x- and y-directions in the $i^{th}$ interferogram.

The term $c_i(x,y)$ in equation (1) represents a location dependent contrast of the sine type of the $i^{th}$ interferogram and can be further modeled as $$c_i(x, y)=cm(x, y)+dc_i+cx_i\cdot x+cy_i\cdot y, \quad (4)$$

wherein
 cm(x,y) is a location dependent average of the constrast over all images,
 $dc_i$ is a constant intensity deviation from the average cm(x,y) of the $i^{th}$ interferogram, and
 $cx_i$ and $cy_i$ are linear deviations from the average cm(x,y) of the intensity in the x- and y-directions in the $i^{th}$ interferogram.

The model of equation (1) also includes a model for a non-linearity of the camera used to record the interferograms. Such non-linearity represented in the example of equation (1) by the expression $$d_i(x, y)\cdot\cos(2\Delta_i(x, y))+e_i(x, y)\cdot\sin(2\Delta_i(x, y)). \quad (5)$$

This expression (5) is based on an understanding that the intensity modulation in the interferograms can follow a sine or cosine law represented in the example of equation (1) by the expression $$b_i(x, y)\cdot\cos(\Delta_i(x, y))+c_i(x, y)\cdot\sin(\Delta_i(x, y)). \quad (6)$$

Any non-linearity applied to such intensity modulation will result in harmonics to such expression. A first order expansion of such harmonics may be represented by the sine and cosine functions according to expression (6) above, wherein the arguments of the sine and cosine functions are multiplied by the factor of 2, resulting in expression (5).

Accordingly, the term $d_i(x,y)$ of equation (1) may be interpreted as location dependent contrast of the harmonics of the cosine type in the $i^{th}$ interferogram, and can be further modeled as $$d_i(x, y)=dm(x, y)+dd_i+dx_i\cdot x+dy_i\cdot y, \quad (7)$$

wherein
 dm(x,y) is a location dependent average of the intensity,
 $dd_i$ is a constant intensity deviation from the average dm(x,y) of the $i^{th}$ interferogram, and
 $dx_i$ and $dy_i$ are linear deviations from the average dm(x,y) of the intensity in the x- and y-directions in the $i^{th}$ interferogram.

The term $e_i(x,y)$ of equation (1) may be interpreted as location dependent contrast of the harmonics of the sine type in the $i^{th}$ interferogram as $$e_i(x, y)=em(x, y)+de_i+ex_i\cdot x+ey_i\cdot y, \quad (8)$$

wherein
 em(x, y) is a location dependent average of the intensity,
 $de_i$ is a constant intensity deviation from the average em(x,y) of the it interferogram, and $ex_i$ and $ey_i$ are linear deviations from the average $em(x,y)$ of the intensity in the x- and y-directions in the $i^{th}$ interferogram.

$\Delta i(x,y)$ in equation (2) represents the location dependent phase of the $i^{th}$ interferogram and may be represented as $$\Delta_i(x, y) = \Phi(x, y) + \delta_i + d\delta_i + mx_i \cdot x + my_i \cdot y, \quad (9)$$

Herein, $\Phi(x, y)$ represents the position dependent phase difference between the light of the reference beam and measuring beam, such that $\Phi(x,y)$ also represents the desired information which is a result of the analysis performed by the controller of the phase shifting interferometer apparatus.

$\delta_i$ represents the pre-determined phase settings generated by the controller for each respective interferogram. $d\delta_i$ is a deviation of the obtained phase setting from the pre-determined phase setting for the interferogram. Thus, the $d\delta_i$ represent deficiencies of the phase shifting interferometer apparatus in view of adjusting a desired phase setting and maintaining the desired phase settings. Thus, an actual value of a phase setting may be represented by the quantity $\delta_i + d\delta_i$, if for example. Thus, any effects of mechanical distortions in the interferometer optics, changes in the refractive indices of the media involved in the optics, such as the refractive indices of the glass and air which is present in the measuring and reference arms of the interferometer is taken into account by the parameter $d\delta_i$.

While $d\delta_i$ is constant across the interferogram, the two other parameters $mx_i$ and $my_i$ allow for a tilt in the wavefronts forming the interferogram in the x and y directions and such tilt might also be introduced by mechanical vibration or temperature gradients in the optics.

The parameters related to actual phase shifts, e.g., $d\delta_i$, $mx_i$ and $my_i$, are adaptable free parameters of the model. The other adaptable free parameters of the model are $\Phi(x,y)$, $a_i(x,y)$, $b_i(x,y)$, $c_i(x,y)$, $d_i(x,y)$, $e_i(x,y)$, $da_i$, $db_i$, $dd_i$, $de_i$, $ax_i$, $bx_i$, $dx_i$, $ex_i$, $ay_i$, $by_i$, $dy_i$, $ey_i$.

These free parameters of the model can be adapted according to a least squares method such that the following expression S becomes a minimum:

$$S = \sum_{i=1}^{n} \sum_{x,y} (J_i(x, y) - I_i(x, y))^2 \quad (10)$$

In this equation $J_i(x,y)$ represents the measured intensities and $I_i(x,y)$ represents the intensities approximated by the model (see equation (1)). Thus, the sum S depends on differences between $J_i(x,y)$ and $I_i(x,y)$.

Of course, any other suitable method of adapting the free adaptable parameters other than a least squares method can be also used (e.g., minimizing the sum the absolute values of the differences between $J_i(x,y)$ and $I_i(x,y)$, minimizing the sum of other powers of the differences, etc.).

After optimizing equation (10), i.e. adapting the free parameters of the model to approximate the recorded interferograms, $\Phi(x,y)$, which represents one group of parameters of the model, can be used in further analysis.

For example, $\Phi(x,y)$ may be used to calculate errors or deviations from a target shape of surface 3 of optical element 5 shown in FIG. 1, according to the formula:

$$h(x, y) = \frac{\lambda}{4\pi} \cdot \Phi(x, y) \quad (11)$$

In the example shown in FIG. 2, $\Phi(x,y)$ may be used to calculate a deviation of an optical density of the plate 5a according to the formula:

$$\delta_n(x, y) = \frac{\lambda \cdot \Phi(x, y)}{4\pi \cdot d(x, y)}, \quad (12)$$

wherein $d(x,y)$ represents an optical thickness of plate 5a at coordinate $(x,y)$.

Figure 3:
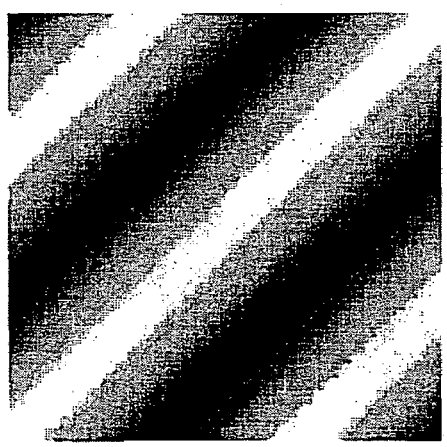
FIGS. 3a to 3d are illustrative examples of images recorded in a phase shifting interferometric method according to the embodiment of the invention using the apparatus shown in FIG. 2.
Figure 3:
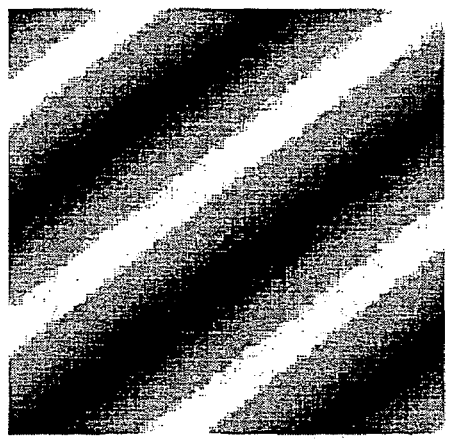
Figure 3:
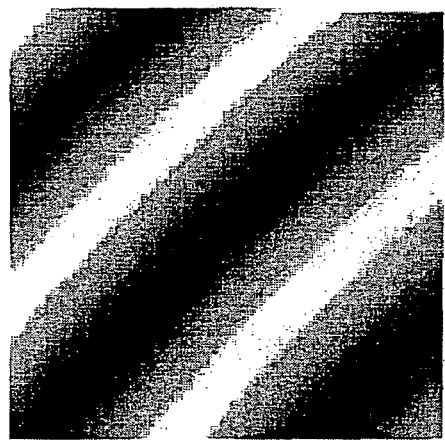
Figure 3:
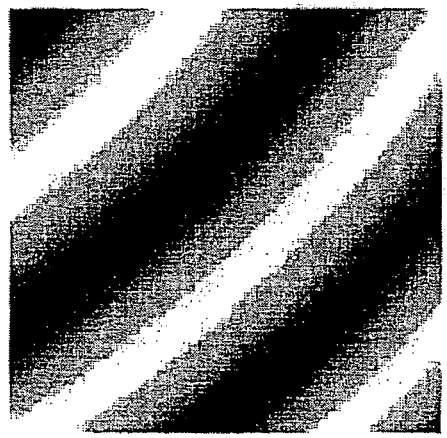

The systems and methods for measuring a physical property illustrated with reference to FIGS. 1 to 3 above may be advantageously used in a manufacture of an optical element having an optical surface manufactured to a high accuracy.

Figure 4:
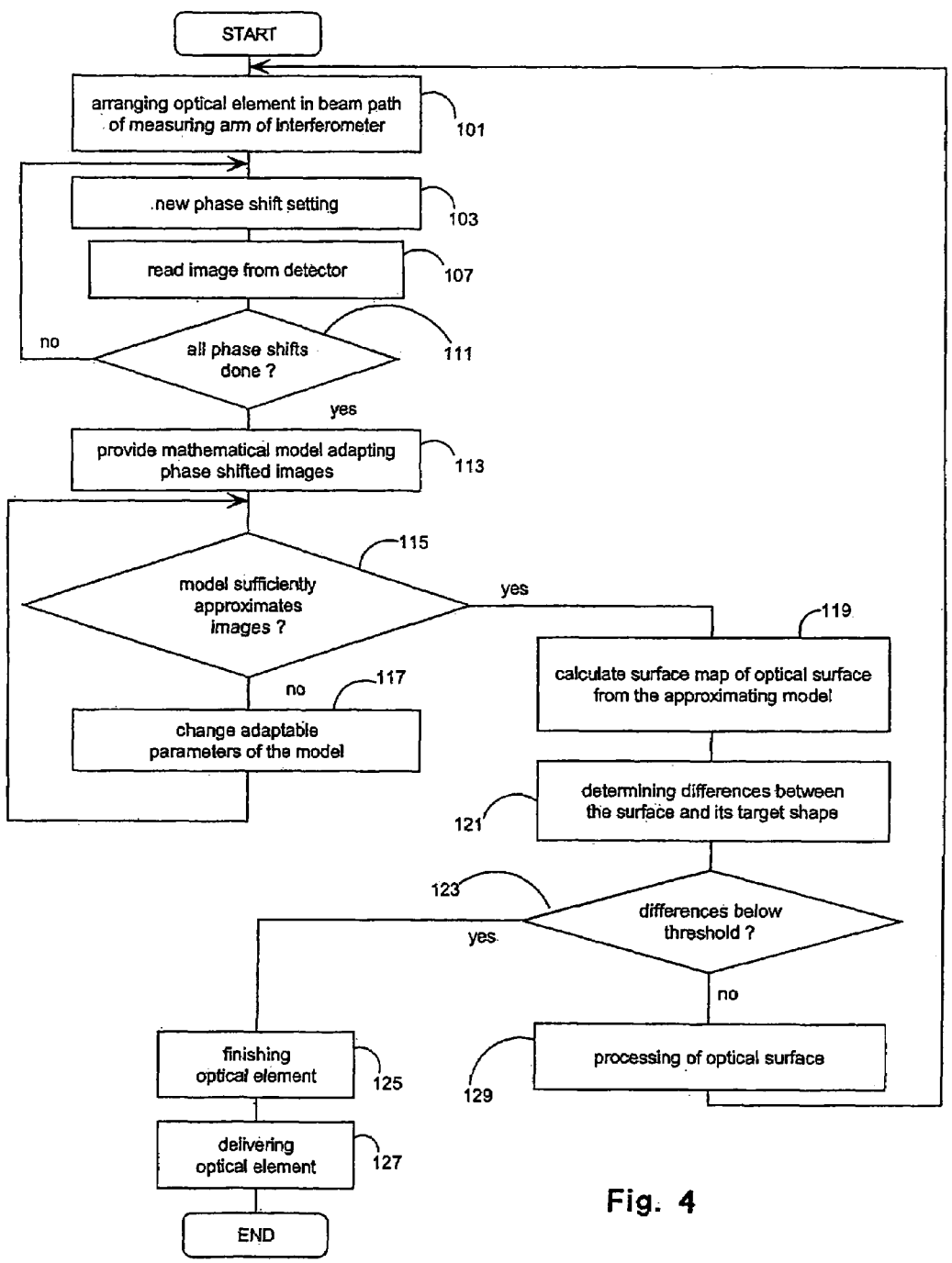
FIG. 4 is a flowchart of a method for manufacturing an optical element according to an embodiment of the present invention.

A method of manufacturing the optical surface to a high accuracy using the phase shifting interferometer apparatus as illustrated above is illustrated with reference to the flowchart shown in FIG. 4. After starting the procedure, the optical element is arranged in the beam path of the beam of measuring light in a step 101. In a step 103, a first wavelength of the light is selected for the measurement of the embodiment of FIG. 1, and a first displacement of the actuator 49 is selected in the embodiment of FIG. 2, for selecting a first phase setting. A first interferogram is recorded in a step 107 by reading out detected light intensities from the camera. Thereafter, a decision ill is made to determine whether interferograms have been performed at all desired phase settings. If not, processing is continued at step 103 to repeatedly record further interferograms in step 107 at further phase settings selected in step 103. After completing the recordings in decision step 111, a model, an example of which is represented by equation (1) above, is provided in a step 113, and in an iterating loop of steps 115 and 117 the adaptable parameters of the model are changed (step 117) such that a decision whether the model sufficiently approximates the recorded interferograms is confirmed in step 115. Thereafter, a surface map of the optical surface can be calculated using equation (11) in a step 119.

Differences between the measured shape of the optical surface and its target shape can be calculated in a step 121, based on the surface map determined in step 119. In a step 123, a decision can be made as to whether the tested surface corresponds to the specification for the finished optical surface. If the differences are below suitably chosen thresholds, a finishing step 125 can be performed on the optical surface. The finishing may include a final polishing of the surface or depositing a suitable coating, such as a reflective coating, an anti-reflective coating, and a protective coating applied to the optical surface by suitable methods, such as sputtering. The reflective coating may comprise, for example, a plurality of layers, such as ten layers of alternating dielectric materials, such as molybdenum oxide and silicon oxide. Thicknesses of such layers may be about 5 nm and will be adapted to a wavelength to be reflected from the optical surface, such that a reflection coefficient is substantially high. Finally, the reflective coating may be covered by a protective cap layer for passivating the reflective coating. The cap layer may include a layer formed by depositing materials such as ruthenium. The anti-reflective coating which is intended to reduce reflections of radiation from the optical surface of the optical element, such as a lens element, may include materials, such as magnesium fluoride, lanthanum oxide and other suitable materials. Also the anti-reflective coating may be passivated by a protective cap layer.

If the determined differences are not below the thresholds in step 123, the procedure can be continued at a step 129 of processing the optical surface. For this purpose, the optical element is removed from the beam path of the interferometer apparatus and mounted on a suitable machine tool to remove those surface portions of the optical surface at which differences between the determined surface shape and the target shape exceed the threshold. Thereafter, the procedure is continued at step 101 and the optical element is again mounted in the beam of measuring light in the interferometer apparatus, and the measurement of the surface shape of the optical surface, determining differences from the target shape and processing is repeated until the differences are below the thresholds.

The processing may include operations such as milling, grinding, loose abrasive grinding, polishing, ion beam figuring and magneto-rheological figuring.

After the optical surface is finished in step 125, the optical element can be delivered and incorporated in an optical system in a step 127. Thereafter a next optical element to be tested can be mounted in the interferometer beam path in a step 101, and repeated measuring and machining of such next surface can be performed until this surface fulfils the specifications.

The above threshold values will depend on the application of the optical surface in the optical system for which it is designed. For example, if the optical surface is a lens surface in an objective for imaging a reticle structure onto a resist with radiation of a wavelength $\lambda=193$ nm, such threshold value may be in a range of about 1 nm to 10 nm, and if the optical surface will be used as a mirror surface in an imaging objective using EUV (extreme ultraviolet) radiation with a wavelength of $\lambda=13.5$ nm, the threshold value will be in a region of about 0.1 nm to 1.0 nm. It is to be noted that it is not necessary that the above mentioned threshold is a constant threshold over the whole area of the optical surface. It is possible that the threshold is dependent on e.g. a distance from a center of the optical surface or some other parameters. In particular, plural thresholds may be defined each for different ranges of spatial frequencies of differences between the measured surface and its target shape.

The above described exemplary embodiments are described in the context of using an interferometer system of a Fizeau-type and a Twyman-Green-type. It is to be noted, however, that the invention is not limited to such types of interferometer. Any other type of interferometer, such as a Michelson-type interferometer, examples of which are illustrated in chapter 2.1 of the text book edited by Daniel Malacara, a Mach-Zehnder-type of interferometer, examples of which are illustrated in chapter 2.6 of the text book edited by Daniel Malacara, a point-diffraction type interferometer, examples of which are illustrated in U.S. Pat. No. 5,548,403 and in the article "Extreme-ultraviolet phase-shifting point-diffraction interferometer: a wavefront metrology tool with subangstrom reference-wave accuracy" by Patrick P. Naulleau et al., Applied Optics-IP, Volume 38, Issue 35, pages 7252 to 7263, December 1999, and any other suitable type of interferometer may be used.

Further, in the above illustrated embodiments, the light source generates light which has a sufficient coherence length such that the measuring arm and the reference arm of the interferometer apparatus can have substantially different optical path length. Again, the invention is not limited to such long coherence length. The concept of the present invention may be also applied to white light interferometry using light sources of a short coherence length such that the optical path length of the measuring and reference arms of the interferometer apparatus differ by not much more of such coherence length.

A computer-readable carrier containing information representing a computer program adapted to cause a processing to execute methods described herein is further provided. The computer readable carrier can be any suitable type of carrier such as solid-state memory, magnetic memory, optical memory, other type of memory, or modulated waves/signals (e.g., radio frequency, audio frequency, or optical frequency modulated waves/signals) suitable for being transmitted through any suitable network, such as the internet.

Summarized, a phase shifting interferometric method comprises generating at least four different phase settings and recording interferograms corresponding to the different phase settings. In the analysis of the recorded interferograms the generated phase shifts between the at least four different phase settings are determined from the measurement, i.e. from the recorded interferograms. A model simulating the interferogram intensities may be used for determining the phase shifts. The phase shifts are free adaptable parameters of the model. Apparatuses and computer readable carriers for implementing methods described herein are also provided as described herein.

The present invention has been described by way of exemplary embodiments to which it is not limited. Variations and modifications will occur to those skilled in the art without departing from the scope of the present invention as recited in the appended claims and equivalents thereof.

The invention claimed is:

1. A phase shifting interferometric method of measuring an object, the method comprising:
   superimposing reference light with measuring light having interacted with the object;
   generating at least four different phase settings of the reference light relative to the measuring light superimposed therewith;
   detecting an image of an intensity distribution of the superimposed reference light and measuring light at each of the different phase settings;
   determining, for each of the different phase settings, a distribution of values corresponding to relative phases between the reference light and the measuring light superimposed therewith, based on the detected images and based on a model for approximating the distribution of the values corresponding to the relative phases, wherein the model has a plurality of adaptable parameters, and wherein the plurality of adaptable parameters comprises at least three phase parameters related to actual values of phase differences between the different phase settings; and
   determining a distribution of a physical property of the object across an area thereof, based on the determined distribution of the values corresponding to the relative phases.

2. The method according to claim 1, wherein the determining of the distribution of the values corresponding to the relative phases comprises calculating, for at least one of the images, a difference between a distribution calculated from the intensity distribution of the image and a modeled distribution based on the model.

3. The method according to claim 2, wherein the determining of the distribution of the values corresponding to the relative phases further comprises calculating the difference for each image, calculating a sum that depends on the calculated differences, and adapting the plurality of adaptable parameters including the at least three phase parameters such that the sum is substantially minimized.

4. The method according to claim 1, wherein the model includes a model of interferogram intensities corresponding to the images.

5. The method according to claim 4, wherein the model of the interferogram intensities comprises a term representing an averaged intensity distribution of the images.

6. The method according to claim 4, wherein the model of the interferogram intensities comprises a term representing an intensity modulation distribution of the images.

7. The method according to claim 6, wherein the term representing the intensity modulation distribution of the images may be substantially represented by a formula:

$$p_i(x, y) \cong b_i(x, y)\cos(\Delta_i(x, y)) + c_i(x, y)\sin(\Delta_i(x, y)),$$

wherein
- i represents an index indicating the respective image;
- x represents a first image coordinate;
- y represents a second image coordinate;
- $p_i(x, y)$ represents the term representing the intensity modulation associated with the $i^{th}$ image;
- $b_i(x, y)$ and
- $c_i(x, y)$ represent distributions of contrasts associated with the $i^{th}$ image; and
- $\Delta_i(x, y)$ represents a distribution of phases associated with the $i^{th}$ image.

8. The method according to claim 4, wherein the model of the interferogram intensities includes a model of a non-linearity of a detector used for detecting the images.

9. The method according to claim 8, wherein the model of the non-linearity of the detector comprises a term which may be substantially represented by a formula:

$$q_i(x, y) \cong d_i(x, y)\cos(2\Delta_i(x, y)) + e_i(x, y)\sin(2\Delta_i(x, y)),$$

wherein
- i represents an index indicating the respective image;
- x represents a first image coordinate;
- y represents a second image coordinate;
- $q_i(x, y)$ represents the term representing the non-linearity associated with the $i^{th}$ image;
- $d_1(x, y), e_i(x, y)$ represent distributions associated with the $i^{th}$ image; and
- $\Delta_i(x, y)$ represents a distribution of phases associated with the $i^{th}$ image.

10. The method according to claim 4, wherein the model of the interferogram intensities comprises at least one term associated with the images and which may be substantially represented by a formula:

$$t_i(x, y) \cong tm(x, y) + dt_i + tx_i \cdot x + ty_i \cdot y,$$

wherein
- i represents an index indicating the respective image;
- x represents a first image coordinate;
- y represents a second image coordinate;
- $t_i(x, y)$ represents the term associated with the $i^{th}$ image;
- $tm(x, y)$ represents a distribution of adaptable parameters associated with all images; and
- $dt_i, tx_i$ and $ty_i$ each represent an adaptable parameter associated with the $i^{th}$ image.

11. The method according to claim 1, wherein the images are detected using an interferometer having a reference arm and a measuring arm in which the object is disposed, and wherein the distribution of the physical property is a distribution of relative optical path length differences between the measuring arm and the reference arm.

12. The method according to claim 1, comprising: determining whether the object satisfies a specification for a finished product based on said distribution of the physical property.

13. The method according to claim 1, comprising: storing said distribution of the physical property in a memory.

14. A phase shifting interferometer apparatus for measuring an object, the apparatus comprising:
- a plurality of optical components providing a reference arm of the interferometer apparatus and a measuring arm of the interferometer apparatus, wherein the object may be disposed in the measuring arm;
- a light source for generating reference light traversing the reference arm and measuring light traversing the measuring arm;
- an image detector for detecting reference light having traversed the reference arm and measuring light superimposed with the reference light and having traversed the measuring arm; and
- a controller configured to determine a distribution of a physical property of the object across an area thereof, based on at least four detected images recorded at different respective phase settings of the reference light relative to the measuring light;
- wherein the controller is further configured to determine, for each of the different phase settings, a distribution of values corresponding to relative phases between the reference light and the measuring light superimposed therewith, based on the recorded images and based on a model for approximating the distribution of the values corresponding to the relative phases;
- wherein the model has a plurality of adaptable parameters, wherein the plurality of adaptable parameters comprises at least three phase parameters related to actual values of phase differences between the different phase settings; and
- wherein the controller is further configured to determine the distribution of the physical property of the object based on the determined distribution of the values corresponding to the relative phases.

15. The apparatus according to claim 14, wherein the plurality of optical components comprises an interferometer optics for forming a beam of measuring light such that the measuring light is substantially orthogonally incident onto a reflecting surface.

16. The apparatus according to claim 15, wherein the reflecting surface is a surface of the object.

17. The apparatus according to claim 15, wherein the interferometer optics comprises a Fizeau surface for reflecting the reference light.

18. A method of analyzing at least four interferograms, the method comprising: determining, for each of the at least four interferograms, a distribution of relative phases associated with the respective interferogram, based on the interferograms and based on a model for approximating the distribution of the relative phases, wherein the model has a plurality of adaptable parameters, and wherein the plurality of adaptable parameters comprises at least three phase parameters related to actual values of phase differences between relative phase settings associated with the interferograms.

19. A computer-readable carrier containing information representing a computer program adapted to cause a processing unit to execute the method of claim 18.

20. The method according to claim 18, comprising:
superimposing reference light with measuring light having interacted with an object to generate said four interferograms; and
determining whether the object satisfies a specification for a finished product based on said distribution of relative phases.

21. The method according to claim 18, comprising:
storing said distribution of relative phases in a memory.

22. A method of manufacturing an optical element using phase shifting interferometry, the method comprising:
superimposing reference light with measuring light having interacted with the optical element;
generating at least four different phase settings of the reference light relative to the measuring light superimposed therewith;
detecting an image of an intensity distribution of the superimposed reference light and measuring light at each of the different phase settings;
determining, for each of the different phase settings, a distribution of values corresponding to relative phases between the reference light and the measuring light superimposed therewith, based on the detected images and based on a model for approximating the distribution of the values corresponding to the relative phases, wherein the model has a plurality of adaptable parameters, and wherein the plurality of adaptable parameters comprises at least three phase parameters related to actual values of phase differences between the different phase settings;
determining a distribution of a physical property of the object across an area thereof, based on the determined distribution of the values corresponding to the relative phases; and
processing the optical element based on the determined distribution of the physical property of the optical element.

23. The method according to claim 22, wherein the determining of the distribution of the values corresponding to the relative phases comprises calculating, for at least one of the images, a difference between a distribution calculated from the intensity distribution of the image and a modeled distribution based on the model.

24. The method according to claim 23, wherein the determining of the distribution of the values corresponding to the relative phases further comprises calculating said difference for each image, calculating a sum of the calculated differences, and adapting the plurality of adaptable parameters including the at least three phase parameters such that the sum of the differences—is substantially minimized.

25. The method according to claim 22, wherein the model includes a model of interferogram intensities corresponding to the images.

26. The method according to claim 25, wherein the model of the interferogram intensities comprises a term representing an averaged intensity distribution of the images.

27. The method according to claim 25, wherein the model of the interferogram intensities comprises a term representing an intensity modulation distribution of the images.

28. The method according to claim 27, wherein the term representing the intensity modulation distribution of the images may be substantially represented by a formula:

$$p_i(x, y) \cong b_i(x, y)\cos(\Delta_i(x, y)) + c_i(x, y)\sin(\Delta_i(x, y)),$$

wherein
i represents an index indicating the respective image;
x represents a first image coordinate;
y represents a second image coordinate;
$p_i(x, y)$ represents the term representing the intensity modulation associated with the $i^{th}$ image;
$b_i(x, y)$ and
$c_i(x, y)$ represent distributions of contrasts associated with the $i^{th}$ image, and
$\Delta_i(x, y)$ represents a distribution of phases associated with the $i^{th}$ image.

29. The method according to claim 25, wherein the model of the interferogram intensities includes a model of a non-linearity of a detector used for detecting the images.

30. The method according to claim 29, wherein the model of the non-linearity of the detector comprises a term which may be substantially represented by a formula:

$$q_i(x, y) \cong d_i(x, y)\cos(2\Delta_i(x, y)) + e_i(x, y)\sin(2\Delta_i(x, y)),$$

wherein
i represents an index indicating the respective image;
x represents a first image coordinate;
y represents a second image coordinate;
$q_i(x, y)$ represents the term representing the non-linearity associated with the $i^{th}$ image;
$d_i(x, y)$, $e_i(x, y)$ represent distributions associated with the $i^{th}$ image; and
$\Delta_i(x, y)$ represents a distribution of phases associated with the $i^{th}$ image.

31. The method according to claim 25, wherein the model of the interferogram intensities comprises at least one term associated with the images and which may be substantially represented by a formula:

$$t_i(x, y) \cong tm(x, y) + dt_i + tx_i \cdot x + ty_i \cdot y,$$

wherein
i represents an index indicating the respective image;
x represents a first image coordinate;
y represents a second image coordinate;
$t_i(x, y)$ represents the term associated with the $i^{th}$ image;
$tm(x, y)$ represents a distribution of adaptable parameters associated with all images; and
$dt_i$, $tx_i$ and $ty_i$ each represent adaptable parameters associated with the $i^{th}$ image.

32. The method according to claim 22, wherein the measuring light having interacted with the optical element is measuring light reflected from a surface of the optical element.

33. The method according to claim 22, wherein the measuring light having interacted with the optical element is measuring light having traversed a surface of the optical element.

34. The method according to claim 22, wherein the physical property is a deviation of a shape of a surface of the optical element from a target shape thereof.

35. The method of claim 34, wherein the target shape is an aspherical shape.

36. The method according to claim 22, wherein the processing of the optical element comprises processing of a surface of the optical element by at least one of milling, grinding, loose abrasive grinding, polishing, ion beam figuring, magneto-rheological figuring, and finishing.

37. The method according to claim 36, wherein the finishing comprises applying a coating to the surface.

38. The method according to claim 36, wherein the coating comprises at least one of a reflective coating, an anti-reflective coating and a protective coating.

* * * * *